(12) United States Patent
Kim et al.

(10) Patent No.: US 8,389,863 B2
(45) Date of Patent: Mar. 5, 2013

(54) FLAT DISPLAY PANEL

(75) Inventors: Hye-Sun Kim, Yongin (KR); Eun-Ah Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/300,488

(22) Filed: Nov. 18, 2011

(65) Prior Publication Data

US 2012/0162938 A1    Jun. 28, 2012

(30) Foreign Application Priority Data

Dec. 28, 2010 (KR) .................. 10-2010-0137212

(51) Int. Cl.
*H05K 1/00* (2006.01)
(52) U.S. Cl. .............. 174/254; 361/679.21; 361/679.28; 361/679.3; 361/749; 349/58; 349/59; 349/60; 174/256; 174/258; 174/260
(58) Field of Classification Search .................. 174/254, 174/258, 256, 260; 361/679.21, 679.28, 361/679.3, 749, 750, 751; 349/58–60, 257
See application file for complete search history.

(56) References Cited

U.S. PATENT DOCUMENTS

2009/0322214 A1  12/2009  Lee et al.
2010/0103641 A1   4/2010  Cho et al.

FOREIGN PATENT DOCUMENTS

KR       10-0953654 B1    4/2010
KR   10-2010-0046478 A    5/2010

*Primary Examiner* — Yuriy Semenenko
*Assistant Examiner* — Andargie M Aychillhum
(74) *Attorney, Agent, or Firm* — Knobbe, Martens, Olson & Bear LLP

(57) ABSTRACT

A flat display panel is disclosed. In one embodiment, the flat display panel includes i) a first substrate on which a display unit is formed, ii) a second substrate formed to face the first substrate, iii) a resin layer formed on the second substrate; a window formed on the resin layer, iv) a flexible printed circuit (FPC) and a spacer formed between the window and the first end of the FPC. A first end of the FPC is combined with the second substrate, and a second end of the FPC is combined with the first substrate, so that the first substrate and the second substrate are electrically connected to each other.

16 Claims, 2 Drawing Sheets

FLAT DISPLAY PANEL

CROSS-REFERENCE TO RELATED PATENT APPLICATION

This application claims the benefit of Korean Patent Application No. 10-2010-0137212, filed on Dec. 28, 2010, in the Korean Intellectual Property Office, the disclosure of which is incorporated herein in its entirety by reference.

BACKGROUND

1. Field

The described technology generally relates to a flat display panel, and more particularly, to a flat display panel in which resin is prevented from being loosened by improving a hardening rate of the resin by securing sufficient incidence of ultraviolet (UV) light for hardening the resin.

2. Description of the Related Technology

Generally, flat display panels may be categorized into light emission type and non-emission type display panels. Examples of light emission type flat display panels include flat cathode ray tubes, plasma display panels, electroluminescent devices, light-emitting diode display panels, etc. Examples of non-emission type flat display panels include liquid crystal displays, etc. Here, the electroluminescent devices feature wide viewing angles, excellent contrasts, and fast response times, and thus the electroluminescent devices are focused as next-generation display devices. The electroluminescent devices are categorized into inorganic electroluminescent devices and organic electroluminescent devices according to materials constituting light-emitting layers.

Here, the organic electroluminescent devices are self-emission type display devices which emit light by electrically exciting fluorescent organic compounds. The organic electroluminescent devices may be driven at a relatively low voltage, easily manufactured slim, and exhibit wide viewing angles and fast response times to resolve problems of LCD devices.

An organic electroluminescent device includes a light-emitting layer, which is formed of an organic material and between an anode electrode and a cathode electrode. In the organic electroluminescent device, as a positive voltage and a negative voltage are respectively applied to the anode electrode and the cathode electrode, holes injected from the anode electrode move to the light-emitting layer via a hole transport layer, whereas electrons move from the cathode electrode to the light-emitting layer via an electron transport layer. At the light-emitting layer, the electrons and the holes are re-combined and excitons are generated. As the state of the excitations is switched from an excited state to a ground state, fluorescent molecules in the light-emitting layer emit light, and thus an image is formed. The full color type organic electroluminescent device includes pixels for emitting red light, green light, and blue light to embody full colors.

Generally, an organic light-emitting display device includes a panel assembly having an organic electroluminescent device, a housing in which the panel assembly is housed, and a printed circuit board (PCB) which is electrically connected to the panel assembly via a flexible circuit board.

SUMMARY

One inventive aspect is a flat display panel in which resin is prevented from being loosened by improving a hardening rate of the resin by securing sufficient incidence of ultraviolet (UV) light for hardening the resin.

Another aspect is a flat display panel including a first substrate on which a display unit is formed; a second substrate formed to face the first substrate; a resin layer formed on the second substrate; a window formed on the resin layer; a flexible printed circuit (FPC), wherein a first end of the FPC is combined with the second substrate, and a second end of the FPC is combined with the first substrate, so that the first substrate and the second substrate are electrically connected to each other; and a spacer formed between the window and the first end of the FPC.

The spacer may be formed to have substantially the same thickness as that of the resin layer. The spacer may be formed to have a thickness substantially the same as a distance between the window and the second substrate. The flat display panel may further include a polarizing plate interposed between the second substrate and the resin layer.

The spacer may be formed to have a thickness that is equal to or greater than that of the resin layer and is smaller than or equal to a sum of the thicknesses of the polarizing plate and the resin layer. The spacer may be formed to have a thickness that is equal to or greater than the thickness of the resin layer and is smaller than or equal to a distance between the second substrate and the window. The spacer may press the first end of the FPC.

The first end of the FPC may be substantially parallel to a top surface of the substrate and the window. The spacer may include one or more of an epoxy-based resin and a glass material. The spacer may be formed of a material via which ultraviolet (UV) light may be transmitted. The spacer may be formed along edges of the resin layer. The FPC may be combined to a portion of the second substrate outside a portion of the second substrate in which the resin layer is formed.

DETAILED DESCRIPTION

Embodiments will now be described more fully with reference to the accompanying drawings.

Figure 1:
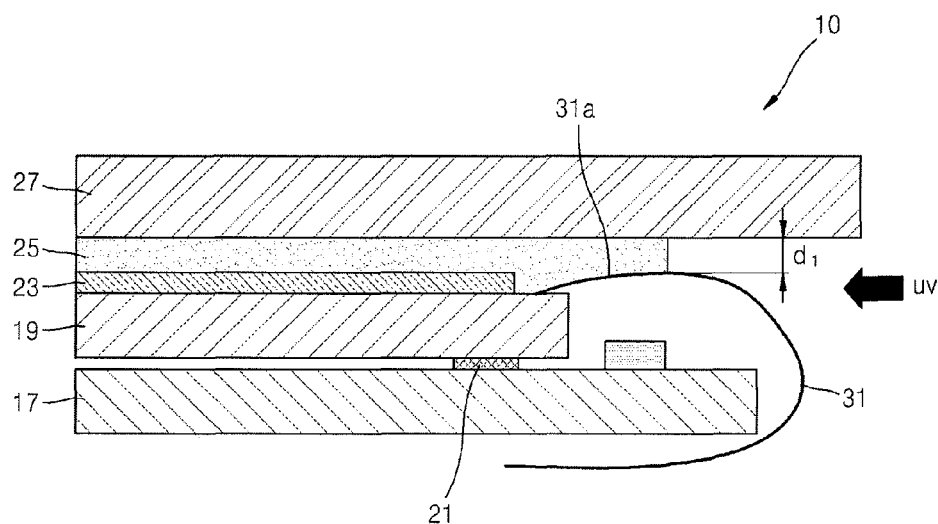
FIG. 1 is a sectional view of a general flat display panel.

FIG. 1 is a sectional view of a general flat display panel. Referring to FIG. 1, a general flat display panel 10 includes a first substrate 17, a second substrate 19, a sealing unit 21, a polarizing plate 23, a resin layer 25, a window 27, and a flexible printed circuit (FPC) 31.

The first substrate 17 and the second substrate 19, which are formed to face each other, are combined via the sealing unit 21. Furthermore, the polarizing plate 23, the resin layer 25, and the window 27 are sequentially stacked on a top surface of the second substrate 19. In one embodiment, the resin layer 25 is formed by applying a resin between the polarizing plate 23 and the window 27 and hardening the resin using ultraviolet (UV) irradiation.

Also, the first and second substrates 17 and 19 are electrically connected to each other via the FPC 31. For example, a first end of the FPC 31 is combined with the first substrate 17, whereas a second end 31a of the FPC 31 is combined with the second substrate 19. Therefore, the first substrate 17 and the second substrate 19 are electrically connected to each other (FIG. 1 shows a state before the first end of the FPC 31 is combined with the first substrate 17).

One embodiment laterally irradiates a sufficient amount of UV light to the resin applied between the polarizing plate 23 and the window 27, so that the resin is hardened and forms the resin layer 25. However, because the FPC 31 has flexibility and elasticity, the first end and the second end 31a of the FPC 31 are curved to be respectively connected to the first and second substrates 17 and 19, and the second end 31a of the FPC 31, combined with the second substrate 19, is slightly elastically deformed upward and lifts up the resin layer 25. Therefore, a distance d1 between the window 27 and the second substrate 19 decreases, and thus an amount of UV light incident via a space between the window 27 and the second substrate 19 to the resin layer 25 also decreases. As a result, a hardening rate of the resin layer 25 is deteriorated, and thus the resin layer 25 is unable to firmly press the FPC 31. Therefore, the FPC 31 may become loose.

Figure 2:
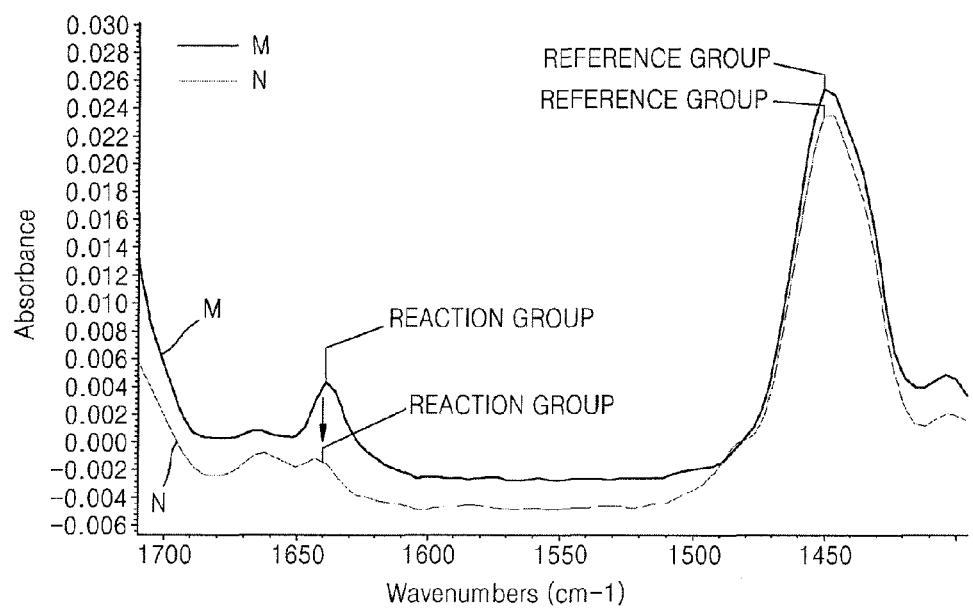
FIG. 2 is a graph showing a hardening rate of a resin in the flat display panel of FIG. 1.

FIG. 2 is a graph showing a hardening rate of a resin in the flat display panel 10 of FIG. 1. In FIG. 2, the horizontal axis indicates wavelength of light, whereas the vertical axis indicates absorbance. Furthermore, in FIG. 2, the line M indicates a spectrum prior to a UV hardening operation, whereas the line N indicates a spectrum after the UV hardening operation.

Here, the hardening rate may be calculated by measuring light absorbance of two materials included in a resin (e.g. a material reacting with UV light and a material not reacting with UV light) prior to and after a UV hardening operation. In other words, since a reference group included in a resin does not react with UV light, inter-atomic bonds thereof are maintained even if UV light is irradiated thereto, and thus the absorbance of the reference group becomes the reference absorbance. On the other hand, a reaction group included in the resin reacts with UV light, inter-atomic bonds thereof are partially cut when UV light is irradiated thereto, and thus the absorbance of the reaction group becomes a measured absorbance for measuring an absorbed amount of UV light. As a result, a hardening rate of a resin may be measured by using a ratio of change of the measured absorbance with respect to change of the reference absorbance. Here, a remaining rate X of the reaction group is defined by Equation 1 below, where a hardening rate is defined as 100—the remaining rate X of the reaction group.

$$\text{Remaining Rate } X \text{ of Reaction Group} = (a/b)/(A/B) * 100\% \quad \text{[Equation 1]}$$

(A=absorbance of reaction group before resin is hardened,
B=absorbance of reference group before resin is hardened,
A=absorbance of reaction group after resin is hardened, and
b=absorbance of reference group after resin is hardened.)

Referring to FIG. 2, the variables above have values in the flat display panel 10 of FIG. 1 as follows.

a=0.00091, b=0.02301, A/B=0.157

Therefore, the remaining rate X of the reaction group is 25.07%, and thus the hardening ratio is 74.93%. However, since a hardening rate above about 90% is generally necessary to prevent loosening of the FPC 31, the FPC 31 partially blocks a path in which UV light is incident in the flat display panel 10 of FIG. 1, and thus a resin may not be sufficiently hardened. As a result, a hardening rate decreases and the FPC 31 may be loosened.

To resolve the problems stated above, a flat display panel according to an embodiment includes a spacer that is arranged on ends of a polarizing plate and a resin layer, wherein the spacer prevents an FPC from blocking a path in which UV light is incident, by pressing the FPC. As a result, a sufficient amount of UV light incident to a resin may be secured, and thus the FPC may be prevented from being loosened. Detailed description thereof will be given below.

Figure 3:
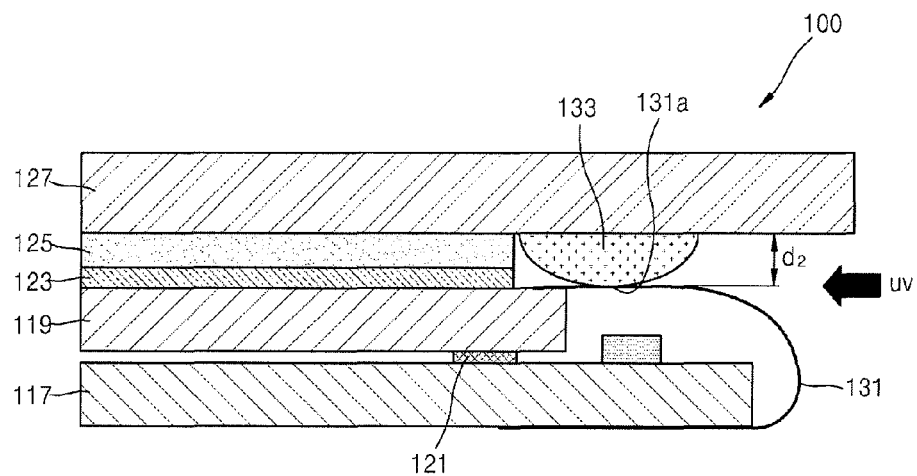
FIG. 3 is a sectional view of a flat display panel according to an embodiment.

FIG. 3 is a sectional view of a flat display panel 100 according to an embodiment.

Referring to FIG. 3, the flat display panel 100 according to the present embodiment includes a first substrate 117, a second substrate 119, a sealing unit 121, a polarizing plate 123, a resin layer 125, a window 127, a FPC 131, and a spacer 133.

In one embodiment, a housing (not shown) constitutes the outer cover of the flat display panel 100, and a panel assembly is housed in the housing. Furthermore, the panel assembly includes the first substrate 117 and the second substrate 119, which are formed to face each other, and the sealing unit 121, which combines the first substrate 117 and the second substrate 119. Furthermore, a display unit (not shown), including an organic electroluminescent device, is disposed on the first substrate 117. Here, the first substrate 117 may be formed of a transparent $SiO_2$-based glass material. The first substrate 117 may also be formed of a transparent plastic material. Also, the second substrate 119 is attached to a top surface of the first substrate 117, on which the display unit (not shown) is disposed. The second substrate 119 may be not only a glass substrate, but also any of various plastic substrates, e.g., acrylic substrate. Furthermore, the second substrate 119 may also be a metal substrate. The first substrate 117 and the second substrate 119 are attached to each other via the sealing unit 121. The sealing unit 121 may be formed of a material generally used in the art; e.g., sealing glass frit.

The polarizing plate 123, the resin layer 125, and the window 127 are sequentially stacked on a top surface of the second substrate 119.

Here, the resin layer 125 is formed in an empty space between the window 127 and the polarizing plate 123 to improve brightness, light transmittance, light reflectivity, and visibility of the flat display panel 100. Here, the resin layer 125 is formed by applying a resin between the polarizing plate 123 and the window 127 and hardening the resin using ultraviolet (UV) irradiation.

Also, the first substrate 117 and the second substrate 119 are connected to each other via the FPC 131. In other words, a first end of the FPC 131 is combined with the first substrate 117, whereas a second end 131a of the FPC 131 is combined with the second substrate 119. Therefore, the first substrate 117 and the second substrate 119 are electrically connected to each other (FIG. 3 shows a state before the first end of the FPC 131 is combined with the first substrate 117).

Also, the spacer 133 is interposed between the window 127 and the FPC 131. In other words, the polarizing plate 123 and the resin layer 125 are sequentially stacked between the second substrate 119 and the window 127, and the spacer 133 is formed at least one side surface of the polarizing plate 123 and the resin layer 125.

Here, the thickness of the spacer 133 may be substantially equal to or greater than that of the resin layer 125 and may be smaller than or substantially equal to the sum of the thicknesses of the polarizing plate 123 and the resin layer 125. In other words, the spacer 133 may be formed to a have a thickness that is substantially equal to or greater than the thickness of the resin layer 125 and smaller than or substantially equal to a distance d2 between the second substrate 119 and the window 127. Here, the thickness of the FPC 131 is very small as compared to those of the second substrate 119, the polarizing plate 123, the resin layer 125, and the window 127, and thus it may be assumed that the thickness of FPC 131 is substantially 0.

Here, the spacer 133 may be formed of a material via which UV light may be transmitted, e.g., an epoxy-based resin or a glass.

As the spacer 133 presses the second end 131a of the FPC 131, the second end 131a of the FPC 131 becomes substantially parallel to the substrate 119 and the window 127 (see comment C below). In other words, as the spacer 133 is formed, the FPC 131 does not occupy the space between the substrate 119 and the window 127. Therefore, a path for irradiating sufficient amount of UV light may be secured, and thus the hardening rate of the resin layer 125 may be improved.

Figure 4:
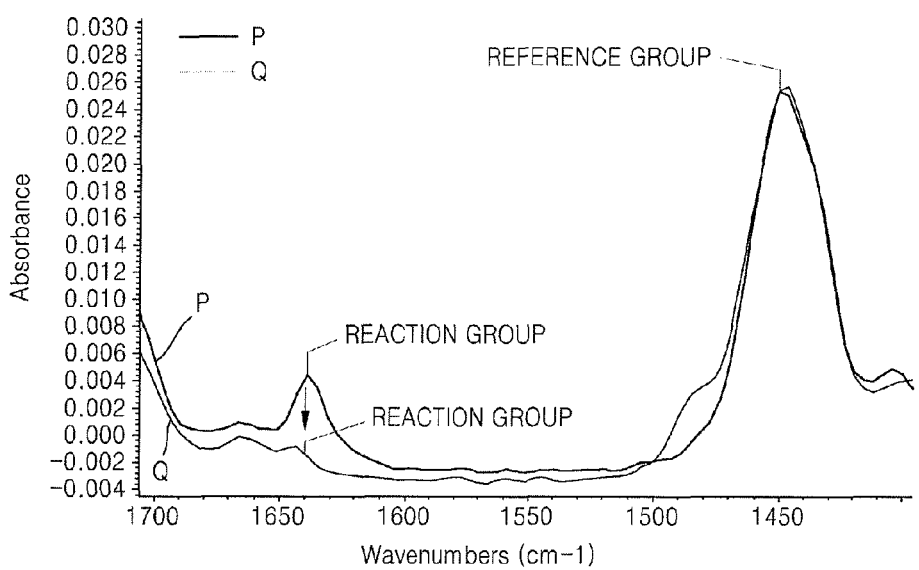
FIG. 4 is a graph showing a hardening rate of a resin in the flat display panel of FIG. 3.

FIG. 4 is a graph showing a hardening rate of a resin in the flat display panel 100 of FIG. 3. In FIG. 4, the horizontal axis indicates wavelength of light, whereas the vertical axis indicates absorbance. Furthermore, in FIG. 4, the line P indicates a spectrum prior to a UV hardening operation, whereas the line Q indicates a spectrum after the UV hardening operation.

TABLE 1

| | Absorbance of Reaction Group Before Hardening | Absorbance of Reference Group Before Hardening | a/b | Remaining Rate (X) (%) of Reaction Group | Hardening Rate |
|---|---|---|---|---|---|
| #1 | 0.00027 | 0.02300 | 0.0117 | 7.4413 | 92.5587 |
| #2 | 0.00023 | 0.02377 | 0.0097 | 6.1336 | 93.8664 |
| #3 | 0.00030 | 0.02327 | 0.0129 | 8.1722 | 91.8278 |
| #4 | 0.00025 | 0.02347 | 0.0107 | 6.7521 | 93.2479 |
| #5 | 0.00031 | 0.02328 | 0.0133 | 8.4410 | 91.5590 |
| Average | | | | 7.3881 | 92.6119 |

As described above, the hardening rate may be calculated by measuring light absorbance of two materials included in a resin (e.g. a material reacting with UV light and a material not reacting with UV light) prior to and after a UV hardening operation. Here, a remaining rate X of the reaction group is defined by Equation 1 above, and the hardening rate is defined as 100—the remaining rate X of the reaction group.

Comparing FIG. 4 to FIG. 2, the absorbance b of the reference group shown in FIG. 4 is similar to that shown in FIG. 2, whereas the absorbance a of the reaction group is about ⅓ of that shown in FIG. 2. In other words, as compared to FIG. 2, due to the increased amount of irradiated UV light, more inter-atomic bonds of the reaction group reacting with the UV light are cut, and thus the remaining rate of the reaction group decreases. Therefore, the hardening rate increases.

As a result of performing five experiments for calculating hardening rate with respect to the flat display panel 100 according to an embodiment, the average hardening rate was about 92.6%, which is more than 2.6% higher than a hardening rate of a resin layer generally required by a flat display panel.

Accordingly, a sufficient gap for incidence of UV light for hardening the resin layer may be secured by forming the spacer 133, which has a thickness substantially equal to or greater than that of the resin layer 125 and via which UV light may be transmitted, outside of the polarizing plate 123 and the resin layer 125. Furthermore, as the hardening rate of the resin layer 125 is improved by securing a sufficient amount of UV light incident to the resin layer 125, the FPC 131 may be prevented from being loosened. Furthermore, as the spacer 133 is formed outside of the polarizing plate 123 and the resin layer 125, the spacer 133 may prevent a resin applied to form the resin layer 125 from overflowing to the outside.

While embodiments have been shown and described with reference to the accompanying drawings, it will be understood by those of ordinary skill in the art that various changes in form and details may be made therein without departing from the spirit and scope of the following claims.

What is claimed is:

1. A flat display panel comprising:
a first substrate on which a display unit is formed; a second substrate facing the first substrate; a resin layer formed over the second substrate; a window formed on the resin layer; a flexible printed circuit (FPC), wherein a first end of the FPC is connected to the second substrate and a second end of the FPC is connected to the first substrate, so that the first and second substrates are electrically connected to each other: A polarizing plate interposed between the second substrate and the resin layer; and a spacer formed between the window and the first end of the FPC; wherein the spacer has a thickness that is greater than or substantially equal to the thickness of the resin layer and is smaller than or substantially equal to the distance between the second substrate and the window.

2. The flat display panel of claim 1 wherein the spacer is configured to press the first end of the FPC.

3. The flat display panel of claim 2, wherein the first end of the FPC is substantially parallel to a top surface of the second substrate and the window.

4. The flat display panel of claim 1 wherein the spacer is formed at least partially of an epoxy-based resin and a glass material.

5. The flat display panel of claim 1 wherein the spacer is formed at least partially of a material configured to transmit ultraviolet (UV) light.

6. The flat display panel of claim 1, wherein the spacer is formed along edges of the resin layer.

7. The flat display panel of claim 1, wherein the FPC is combined to a portion of the second substrate outside a portion of the second substrate in which the resin layer is formed.

8. The flat display panel of claim 1, wherein the resin layer is closer to the second substrate than the first substrate.

9. A flat display panel comprising:
a first substrate on which a display unit is formed; a second substrate facing the first substrate; a resin layer formed over the second substrate; a window formed on the resin layer; a flexible printed circuit (FPC), wherein a first end of the FPC is connected to the second substrate and a second end of the FPC is connected to the first substrate, so that the first and second substrates are electrically connected to each other: A polarizing plate interposed between the second substrate and the resin layer: and a spacer formed between the window and the first end of the FPC, wherein the spacer has a thickness that is greater than or substantially equal to that of the resin layer and is smaller than or substantially equal to the sum of the thickness of the polarizing plate and the resin layer.

10. The flat display panel of claim 1 wherein the spacer is configured to press the first end of the FPC.

11. The flat display panel of claim 2, wherein the first end of the FPC is substantially parallel to a top surface of the second substrate and the window.

12. The flat display panel of claim 1 wherein the spacer is formed at least partially of an epoxy-based resin and a glass material.

13. The flat display panel of claim 1 wherein the spacer is formed at least partially of a material configured to transmit ultraviolet (UV) light.

14. The flat display panel of claim 1, wherein the spacer is formed along edges of the resin layer.

15. The flat display panel of claim 1, wherein the FPC is combined to a portion of the second substrate outside a portion of the second substrate in which the resin layer is formed.

16. The flat display panel of claim 1, wherein the resin layer is closer to the second substrate than the first substrate.

* * * * *